United States Patent [19]
Zlotnick

[11] Patent Number: 5,493,239
[45] Date of Patent: Feb. 20, 1996

[54] CIRCUIT AND METHOD OF CONFIGURING A FIELD PROGRAMMABLE GATE ARRAY

[75] Inventor: Fredrick Zlotnick, Scottsdale, Ariz.

[73] Assignee: Motorola, Inc., Schaumburg, Ill.

[21] Appl. No.: 381,388

[22] Filed: Jan. 31, 1995

[51] Int. Cl.⁶ .............................................. H03K 19/177
[52] U.S. Cl. .............................. 326/38; 326/40; 364/716
[58] Field of Search ...................... 340/825.83; 364/716; 326/38, 39, 40

[56] References Cited

U.S. PATENT DOCUMENTS

| | | | |
|---|---|---|---|
| 4,870,302 | 9/1989 | Freeman | 326/39 |
| 4,930,107 | 5/1990 | Chan et al. | 326/38 |
| 4,940,909 | 7/1990 | Mulder et al. | 326/38 |
| 5,394,031 | 2/1995 | Britton et al. | 340/825.83 |

FOREIGN PATENT DOCUMENTS

94/08399  4/1994  WIPO ..................................... 326/38

Primary Examiner—Edward P. Westin
Assistant Examiner—Benjamin D. Driscoll
Attorney, Agent, or Firm—Robert D. Atkins

[57] ABSTRACT

A field programmable gate array (FPGA) configuration circuit reads configuration data from a memory (12) and converts the parallel data to a serial data stream through a shift register (16) clocked by a clock signal. A first FPGA (18) controls the serial data stream by providing the clock signal when enabled by a start signal. Once the configuration data has been completely loaded into the first FPGA, the first FPGA outputs a done signal to a second FPGA (20) to enable it's clock to control the serial data stream into the second FPGA. The clock from the first FPGA is disabled. Each FPGA passes control to the next FPGA in a daisy chain arrangement by enabling the clock source from the next FPGA while disabling the clock source from previous FPGA as each finishes loading its configuration data.

19 Claims, 2 Drawing Sheets

CIRCUIT AND METHOD OF CONFIGURING A FIELD PROGRAMMABLE GATE ARRAY

BACKGROUND OF THE INVENTION

The present invention relates in general to field programmable gate arrays and, more particularly, to a circuit and method of configuring a field programmable gate array.

Field programmable gate arrays (FPGA) are commonly used in electronic circuit design to perform a logic function. The FPGA is enclosed in an integrated circuit (IC) package, and a number of FPGA IC packages are typically disposed on a printed circuit board. The FPGA includes an array of logic gates, e.g. NAND gates, interconnected by switching circuits such as transistors. The switching transistors are enabled and disabled as necessary to achieve the desired logic function.

The FPGA must be programmed to enable and disable the interconnecting switching transistors and configure the logic array according to the desired function. In the prior art, some FPGAs have an internal EPROM where each data bit enables or disables one switching transistor in the array. The approach of having an EPROM disposed on each FPGA is expensive and consumes a large space on the IC die.

Another prior art technique uses a single EPROM and passes data and address signals to each FPGA on the printed circuit board. The data bus (8 lines) and address bus (17 lines) metal structure from the EPROM must be routed to many areas of the printed circuit board to configure each FPGA IC. Routing 25 bus lines consumes a large amount of printed circuit board space. Alternately, U.S. Pat. No. 4,870,302 discloses one EPROM that sends parallel data to a master configurable logic array (CLA). The master CLA configures itself and then passes configuration data serially to a first slave CLA. Once the first slave CLA is configured, the first slave CLA passes the serial data along to a second slave CLA, and so on. Thus, fewer data and control lines need be routed around the printed circuit board for configuration. Unfortunately, the master/slave approach tends to complicate the configuration logic and may require synchronization between the master CLA and slave CLAs.

Hence, a need exists to simplify the configuration of FPGAs while using a single data line.

DETAILED DESCRIPTION OF THE PREFERRED EMBODIMENT

Figure 1:
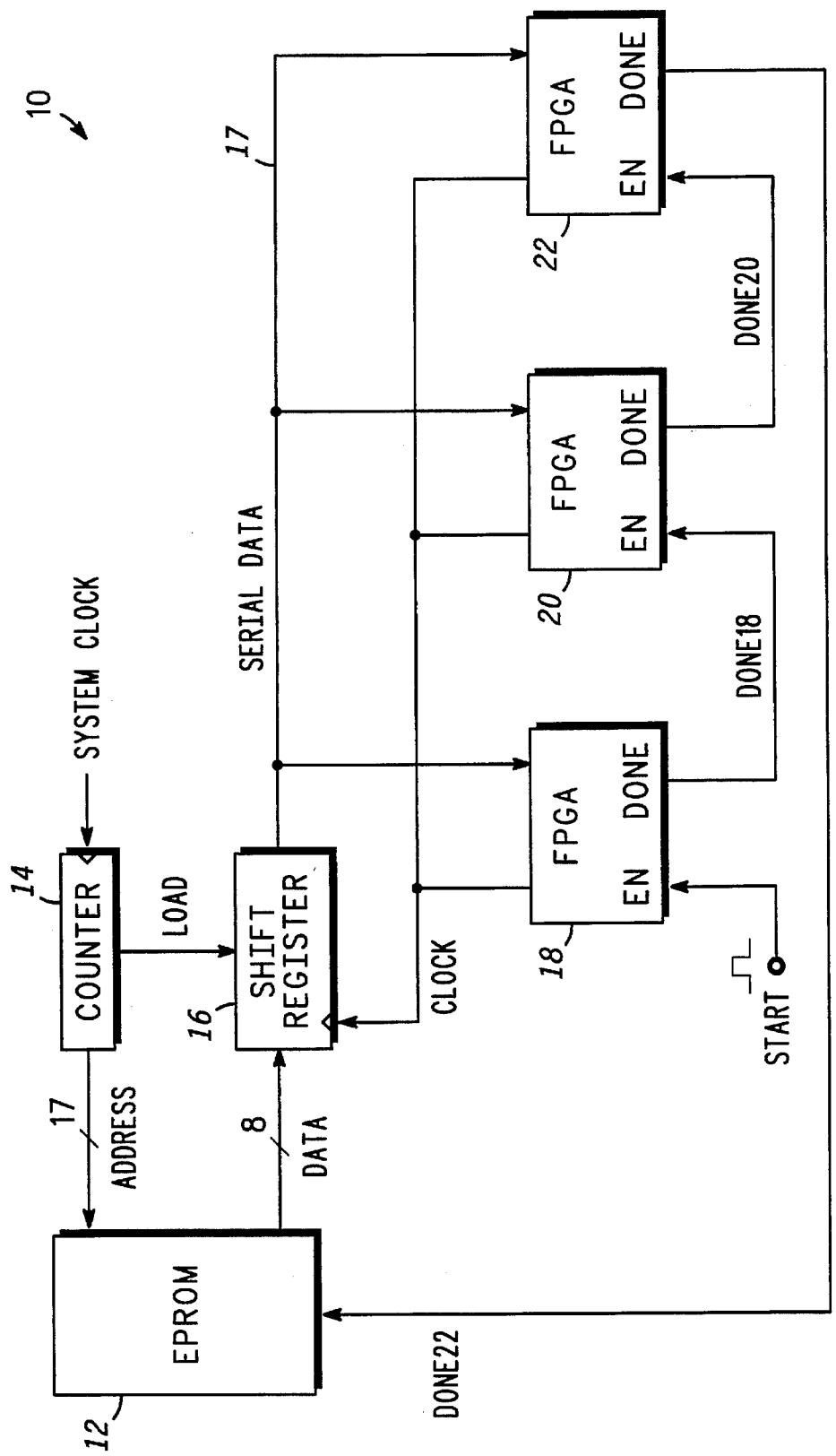
FIG. 1 is a block diagram illustrating configuration of FPGAs on a printed circuit board.

Referring to FIG. 1, a printed circuit board 10 is shown with an EPROM 12 containing FPGA configuration data in 8-bit words. Counter 14 counts with a SYSTEM CLOCK operating at say 625.0 KHz and provides a 17-bit ADDRESS to EPROM 12. An 8-bit DATA word is retrieved from EPROM 12 corresponding to the ADDRESS signal. Counter 14 also provides a LOAD control signal to shift register 16 with each SYSTEM CLOCK to load the 8-bit DATA word from EPROM 12. Shift register 16 receives a 5.0 MHz CLOCK signal to serially shift data out as SERIAL DATA, one bit at a time on a single data line 17. FPGAs 18, 20 and 22 are each coupled for receiving the SERIAL DATA signal.

FPGA 18 includes an EN (enable) input receiving a START control signal, and a DONE output coupled to the EN input of FPGA 20. Likewise, the DONE output of FPGA 20 is coupled to the EN input of FPGA 22. The DONE output of FPGA 22 is coupled back to EPROM 12.

When printed circuit board 10 is first powered up, or reset, the FPGAs must be configured according to the predetermined logic function stored in EPROM 12. Counter 14 begins counting from the first address of configuration data, e.g. ADDRESS="00000000000000000". EPROM 12 retrieves the 8-bit DATA word at the specified address and shift register 16 loads the data upon receiving a LOAD control signal. After power-up or reset, the START control signal is pulsed to logic one to load the first FPGA. FPGA 18 is arbitrarily chosen as the first one to be programmed although any one of the FPGAs could made first by connecting its EN input to the START control signal. A logic one START control pulse sets a latch in FPGA 18 to enable it to provide the CLOCK signal to shift register 16. The CLOCK outputs from FPGAs 20 and 22 are disabled. The SERIAL DATA loads into FPGA 18 under Control of the CLOCK signal from FPGA 18 as described below. EPROM 12 continues providing DATA words to shift register 16 which in turn continues shifting out SERIAL DATA into FPGA 18 in response to the CLOCK signal from FPGA 18. FPGA 18 thus controls the loading of its own configuration data. Once FPGA 18 is fully configured, its DONE output pulses DONE18 to logic one which disables the latch in FPGA 18 previous set by the START pulse and passes control to the next FPGA.

FPGA 20 is the second one to be programmed because its EN input is coupled to the DONE output of the first configured FPGA. FPGA 20 is enabled by the logic one DONE18 control pulse that sets a latch in FPGA 20 and provides the CLOCK signal to shift register 16. The CLOCK outputs from FPGAs 18 and 22 are disabled. The SERIAL DATA loads into FPGA 20 under control of the CLOCK signal from FPGA 20. EPROM 12 continues providing DATA words to shift register 16 which in turn continues shifting out SERIAL DATA into FPGA 20 in response to the CLOCK signal from FPGA 20. FPGA 20 thus controls the loading of its own configuration data. Once FPGA 20 is fully configured, its DONE output pulses DONE20 to logic one which disables the latch in FPGA 20 previous set by DONE18 and passes control to the next FPGA.

FPGA 22 is the third one to be programmed because its EN input is coupled to the DONE output of the second configured FPGA. FPGA 22 is enabled by the logic one DONE20 control pulse that sets a latch in FPGA 22 and provides the CLOCK signal to shift register 16. The CLOCK outputs from FPGAs 18 and 20 are disabled. The SERIAL DATA loads into FPGA 22 under control of the CLOCK signal from FPGA 22. EPROM 12 continues providing DATA words to shift register 16 which in turn continues shifting out SERIAL DATA into FPGA 22 in response to the CLOCK signal from FPGA 22. FPGA 22 thus controls the loading of its own configuration data. Once FPGA 22 is fully configured, its DONE output pulses DONE22 to logic one to disable the latch in FPGA 22 previous set by DONE20. The DONE22 pulse also stops EPROM 12 and completes the configuration process.

Figure 2:
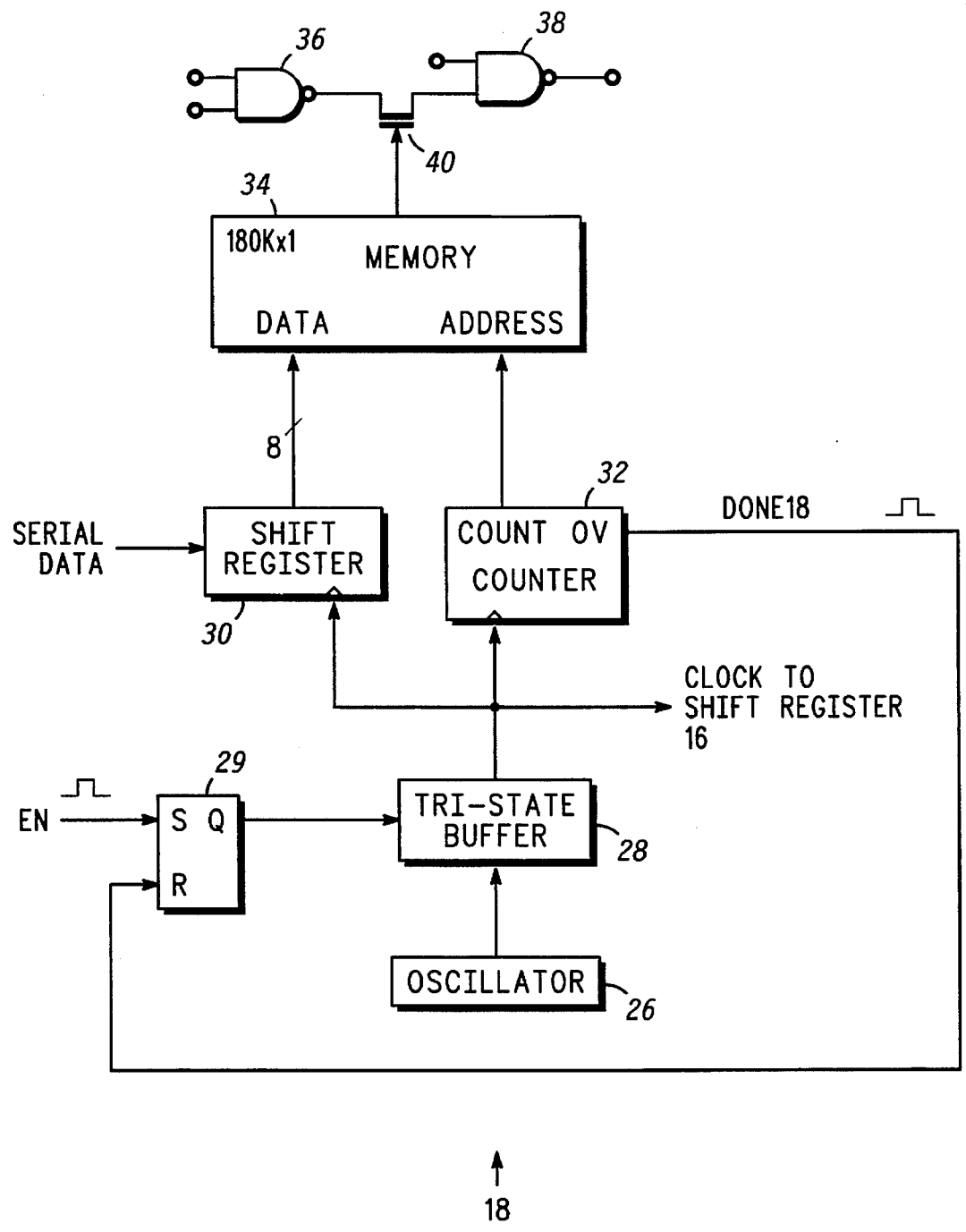
FIG. 2 is a block diagram illustrating further detail of the FPGA of FIG. 1.

Further detail of FPGA 18 is shown in FIG. 2. FPGAs 20 and 22 follow a similar structure and operation. FPGA 18 includes oscillator 26 having a string of serially coupled inverters operating as a ring oscillator. The output of oscillator 26 is routed through tri-state buffer 28 that passes the oscillator CLOCK signal to shift register 16 when enabled by a logic one from RS latch 29. The logic one START pulse is applied to a set input of RS latch 29, while the DONE18 control pulse is applied to a reset input of RS latch 29. The Q-output of RS latch 29 is coupled to an enable input of tri-state buffer 28. The DONE18 and DONE20 control signals are applied to set inputs of corresponding RS latches 29 in FPGAs 20–22, respectively. The reset input of RS latch 29 in FPGA 20 receives the DONE20 control pulse, while the reset input of RS latch 29 in FPGA 22 receives the DONE22 control pulse. Thus, a logic one START pulse sets the Q-output of RS latch 29 to logic one which enables tri-state buffer 28 to pass the oscillator CLOCK signal. A logic one DONE18 pulse resets the Q-output of RS latch 29 to logic zero to disable tri-state buffer 28 and block the oscillator CLOCK signal.

Shift register 30 receives the SERIAL DATA signal from shift register 16 and shifts in data bits when CLOCK is active. Counter 32 includes a divide-by-eight circuit (not shown) to increment its count every eighth clock cycle. The DONE18 control signal pulses to logic one once counter 32 reaches a predetermined value (22,500) indicating that memory 34 is full and that the configuration of FPGA 18 is complete. Memory 34 is 180K×1 bits. Shift register 30 shifts in eight bits every eight CLOCK cycles and counter 32 provides an address into memory 34 to store the eight bits. The first eight bits from shift register 30 go into the first eight bit locations, and the second eight bits go in the second eight bits locations, and so on.

The logic array of FPGA 18 includes an array of NAND gates such as NAND gates 36 and 38. When enabled, switching transistor 40 connects the output of NAND gate 36 to one input of NAND gate 38. One bit location of memory 34 is coupled to the gate of switching transistor 40 to enable its operation. FPGA 18 typically includes many more logic gates with interconnecting switching transistors (not shown). Each bit location of memory 34 is coupled to the gate of one of the switching transistors.

When the START signal pulses to logic one, the Q-output of RS latch 29 is set to logic one to enable tri-state buffer 28 to pass the CLOCK signal and fill shift register 30. The CLOCK signal from FPGA 18 also controls shift register 16 to continue serially shifting data into FPGA 18. Counter 32 increments the address of memory 34 every eight clocks. Memory 34 thus fills with the configuration data for FPGA 18. When counter 32 counts up to 22,500 (180,000/8), the DONE18 control signal pulses to logic one on overflow of counter 32 indicating that memory 34 is full and that the configuration of FPGA 18 is complete. The logic one DONE18 pulse resets RS latch 29 to logic zero to tri-state the output of buffer 28 and disable the CLOCK from FPGA 18.

The DONE18 control pulse also sets RS latch 29 in FPGA 20 to enable tri-state buffer 28 in FPGA 20 and repeat the aforedescribed process by filling memory 34 in FPGA 20 with its configuration data from EPROM 12. When counter 32 in FPGA 20 reaches its predetermined count indicating that the memory is filled with configuration data, DONE20 pulses to logic one to reset RS latch 29 in FPGA 20 to disable the CLOCK signal from FPGA 20. The DONE20 control pulse also sets RS latch 29 in FPGA 22 to enable tri-state buffer 28 in FPGA 22 and fill memory 34 in FPGA 22 with its configuration data from EPROM 12. When DONE22 pulses to logic one upon completion of loading FPGA 22 configuration data, the RS latch in FPGA 22 resets to tri-state buffer 28 and disable the CLOCK signal from FPGA 22. The DONE22 pulse also disables EPROM 12 to discontinue sending data. FPGAs 18–22 are configured ready for operation.

By now it should be appreciated that the present invention provides for configuration of FPGAs with a serial configuration data line. A first FPGA controls the serial data line by providing the clocking of its own configuration data. The control over the serial data line passes from the first FPGA to a second FPGA once the configuration of the first FPGA is complete. The second FPGA exercises control over the serial data line by performing the clocking of its own configuration data. Each FPGA passes control to the next FPGA in a daisy chain arrangement as each finishes loading its configuration data. By having each FPGA control is own configuration data loading, the present invention avoids synchronization concerns between the FPGAs and simplifies the configuration process.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit for configuring a plurality of field programmable gate arrays (FPGA), comprising:

a first memory providing a data word at an output in response to an address signal;

a first shift register having a data input, a clock input and a serial output, said data input being coupled for receiving said data word, said clock input being coupled for receiving a clock signal;

a first FPGA having a data input, an enable input, a done output, and a clock output, said data input being coupled to said serial output of said first shift register, said enable input being coupled for receiving a start signal, said clock output providing said clock signal to said first shift register when enabled by said start signal, said done output providing a logic signal indicating completion of loading configuration data into said first FPGA; and a second FPGA having a data input, an enable input, a done output, and a clock output, said data input being coupled to said serial output of said first shift register, said enable input being coupled to said done output of said first FPGA, said clock output providing said clock signal to said first shift register when enabled by said logic signal from said done output of said first FPGA.

2. The circuit of claim 1 wherein said second FPGA further includes a done output for providing a logic signal indicating completion of loading configuration data into said second FPGA.

3. The circuit of claim 2 further including a third FPGA having a data input, an enable input, a done output, and a clock output, said data input being coupled to said serial output of said first shift register, said enable input being coupled to said done output of said second FPGA, said clock output providing said clock signal to said first shift register when enabled by said logic signal from said done output of said second FPGA.

4. The circuit of claim 3 further including a first counter having a clock input, a count output, and a load output, said clock input being coupled for receiving a system clock signal, said count output providing said address signal to said first memory, said load output providing a load control signal of said first shift register.

5. The circuit of claim 2 wherein said first FPGA includes:

a latch having a set input, a reset input, and an output, said set input being coupled for receiving said start signal, said reset input being coupled for receiving said logic signal indicating completion of loading configuration data into said first FPGA;

an oscillator having an output for providing an oscillator signal; and a tri-state buffer having an input, an enable input and an output, said input being coupled to said output of said oscillator, said enable input being coupled to said output of said latch, said output providing said clock signal of said first FPGA.

6. The circuit of claim 5 wherein said first FPGA further includes:

a second shift register having an input coupled to said data input of said first FPGA and having a clock input coupled for receiving said clock signal of said first FPGA;

a second memory having an input coupled to an output of said second shift register; and a first counter having a clock input, a count output, and a done output, said clock input being coupled for receiving said clock signal of said first FPGA, said count output providing an address signal to said second memory, said done output providing said logic signal indicating completion of loading configuration data into said first FPGA.

7. The circuit of claim 6 wherein said first FPGA further includes:

a first NAND gate having first and second input coupled for receiving logic signals;

a switching transistor having a gate, a drain and a source, said drain being coupled to an output of said first NAND gate, said gate being coupled to an output of said second memory; and a second NAND gate having an input coupled to said source of said switching transistor.

8. A field programmable gate array (FPGA) configuration circuit, comprising:

a first memory providing a data word at an output in response to an address signal;

a first shift register having a data input, a clock input and a serial output, said data input being coupled for receiving said data word, said clock input being coupled for receiving a clock signal; and a plurality of FPGAs each having a data input, an enable input, a done output, and a clock output, where said data input of a first FPGA is coupled to said serial output of said first shift register, and said enable input of said first FPGA is coupled for receiving a start signal, and said clock output of said first FPGA provides said clock signal to said first shift register when enabled by said start signal, and said done output of said first FPGA provides a logic signal indicating completion of loading configuration data into said first FPGA, and where said data input of a second FPGA is coupled to said serial output of said first shift register, and said enable input of said second FPGA is coupled to said done output of said first FPGA, and said clock output of said second FPGA provides said clock signal to said first shift register when enabled by said logic signal from said done output of said first FPGA.

9. The FPGA configuration circuit of claim 8 wherein said second FPGA further includes a done output for providing a logic signal indicating completion of loading configuration data into said second FPGA.

10. The FPGA configuration circuit of claim 9 wherein said plurality of FPGAs further includes a third FPGA having a data input, an enable input, a done output, and a clock output, said data input being coupled to said serial output of said first shift register, said enable input being coupled to said done output of said second FPGA, said clock output providing said clock signal to said first shift register when enabled by said logic signal from said done output of said second FPGA.

11. The circuit of claim 10 further including a first counter having a clock input, a count output, and a load output, said clock input being coupled for receiving a system clock signal, said count output providing said address signal to said first memory, said load output providing a load control signal of said first shift register.

12. The FPGA configuration circuit of claim 9 wherein said first FPGA includes:

a latch having a set input, a reset input, and an output, said set input being coupled for receiving said start signal, said reset input being coupled for receiving said logic signal indicating completion of loading configuration data into said first FPGA;

an oscillator having an output for providing an oscillator signal; and a tri-state buffer having an input, an enable input and an output, said input being coupled to said output of said oscillator, said enable input being coupled to said output of said latch, said output providing said clock signal of said first FPGA.

13. The FPGA configuration circuit of claim 12 wherein said first FPGA further includes:

a second shift register having an input coupled to said data input of said first FPGA and having a clock input coupled for receiving said clock signal of said first FPGA;

a second memory having an input coupled to an output of said second shift register; and a first counter having a clock input, a count output, and a done output, said clock input being coupled for receiving said clock signal of said first FPGA, said count output providing an address signal to said second memory, said done output providing said logic signal indicating completion of loading configuration data into said first FPGA.

14. The FPGA configuration circuit of claim 13 wherein said first FPGA further includes:

a first NAND gate having first and second input coupled for receiving logic signals;

a switching transistor having a gate, a drain and a source, said drain being coupled to an output of said first NAND gate, said gate being coupled to an output of said second memory; and a second NAND gate having an input coupled to said source of said switching transistor.

15. A method of configuring a plurality of field programmable gate arrays (FPGA), comprising the steps of:

retrieving a data word from a memory storage location specified by an address signal;

converting said data word into a serial data stream in response to a clock signal;

enabling a first oscillator signal in a first FPGA to act as said clock signal upon receiving start signal;

disabling a second oscillator signal in a second FPGA;

storing said serial data stream into a memory storage location of said first FPGA in response to said clock signal from said first FPGA;

generating a done signal when said first FPGA is loaded with configuration data from said serial data stream;

disabling said first oscillator signal in said first FPGA;

enabling said second oscillator signal in said second FPGA to act as said clock signal upon activating said done signal from said first FPGA; and storing said serial data stream into a memory storage location of said second FPGA in response to said clock signal from said second FPGA.

16. The method of claim 15 further including the step of generating a done signal from said second FPGA indicating completion of loading configuration data from said serial data stream into said second FPGA.

17. The method of claim 16 further including the steps of:

enabling a third oscillator signal in a third FPGA to act as said clock signal upon receiving said done signal from said second FPGA; and disabling said second oscillator signal in said second FPGA.

18. The method of claim 17 further including the step of storing said serial data stream into a memory storage location of said third FPGA in response to said clock signal from said third FPGA.

19. The method of claim 18 further including the steps of:

generating a done signal from said third FPGA indicating completion of loading configuration data from said serial data stream into said third FPGA; and disabling said third oscillator signal in said third FPGA.

* * * * *